(12) United States Patent
Mirth

(10) Patent No.: US 8,852,967 B2
(45) Date of Patent: Oct. 7, 2014

(54) DISSOLUTION RATE MONITOR

(71) Applicant: Intermolecular, Inc., San Jose, CA (US)

(72) Inventor: George Mirth, Saratoga, CA (US)

(73) Assignee: Intermolecular, Inc., San Jose, CA (US)

( * ) Notice: Subject to any disclaimer, the term of this patent is extended or adjusted under 35 U.S.C. 154(b) by 123 days.

(21) Appl. No.: 13/721,534

(22) Filed: Dec. 20, 2012

(65) Prior Publication Data

US 2014/0179030 A1  Jun. 26, 2014

(51) Int. Cl.
*H01L 21/66* (2006.01)
*C23F 1/00* (2006.01)
*H01L 21/67* (2006.01)

(52) U.S. Cl.
CPC .......... *H01L 22/10* (2013.01); *H01L 21/67063* (2013.01)
USPC .............. 438/14; 438/8; 438/17; 156/345.15; 156/345.24

(58) Field of Classification Search
USPC ........... 438/7, 8, 9, 14, 16, 17, 689, 745, 746; 156/345.11, 345.15, 345.16, 345.24
See application file for complete search history.

(56) References Cited

U.S. PATENT DOCUMENTS

| 8,697,338 B2 * | 4/2014 | Bae et al. ...................... 430/311 |
| 2011/0159253 A1 * | 6/2011 | Kang et al. ................. 428/195.1 |
| 2012/0219755 A1 * | 8/2012 | Bae et al. ..................... 428/141 |

* cited by examiner

*Primary Examiner* — Kevin M Picardat

(57) ABSTRACT

A multiple channel site-isolated reactor system and method are described. The system contains a reactor block with a plurality of reactors. Input lines are coupled to each reactor to provide a fluid to the respective reactors. A sealing element associated with each reactor contacts a surface of a substrate disposed below the reactor block, which defines isolated regions on the surface of the substrate. A dissolution rate monitor extends into each reactor to monitor a rate of real-time dissolution of one or more layers on the surface of the substrate when it is disposed proximate to the surface of the substrate.

20 Claims, 7 Drawing Sheets

US 8,852,967 B2

DISSOLUTION RATE MONITOR

BACKGROUND

The etch rate or dissolution rate of a thin film on a semiconductor substrate can be determined by taking measurements of the thin film before and after a particular etching process. The time for the particular etching process to reach an end point is specified from pre-etch measurements, pre-dissolution measurements, or pre-clean measurements, as well as post-etch measurements, post-dissolution measurements, or post-clean measurements. Thin film metrology equipment, such as an ellipsometer, can be used to measure a film thickness before and after applying a process or a set of processes. A number of time series experiments must be conducted in order to capture the accurate dissolution rate for each particular thin film especially where reactors cannot run experiments for short times due to process or equipment constraints. As a result, several experiments may need to be conducted to determine the dissolution rates for a multiple layered semiconductor substrate. For example, when conducting multiple experiments on a substrate a user must run a time series experiment which varies time in an attempt to capture varying etch or dissolution rates in the film. The equipment for conducting the multiple experiments is not capable of allowing for very short process times due to process and equipment constraints. Thus, meaningful thin film induction dissolution effects and differences are unable to be captured with the current equipment.

It is within this context that the embodiments arise.

SUMMARY

In some embodiments, a reactor for a multiple channel site-isolated reactor system is described. The reactor contains one or more fluid input lines connected to a first end of the reactor. A sealing element is disposed at a second end of the reactor to form a sealing contact with a surface of a substrate. A dissolution rate monitor extends into the reactor. The dissolution rate monitor is operable to monitor a rate of real-time dissolution of one or more layers of the surface of the substrate when the dissolution rate monitor is disposed near the surface of the substrate. In some embodiments, multiple reactors are included.

In some embodiments, a method of monitoring a dissolution rate of a semiconductor substrate is described. A semiconductor substrate containing one or more layers is provided. A region of a surface of the semiconductor substrate is isolated by contacting a sealing element of a reactor with the surface of the semiconductor substrate. One or more fluids are applied to the isolated region of the surface through the reactor. A real-time rate of dissolution of the isolated region of the semiconductor substrate is monitored via a dissolution rate monitor.

In some embodiments, a multiple reactor site-isolated reactor system is described. The system contains a reactor block with a plurality of reactors. Input lines are coupled to each reactor to provide a fluid to the respective reactors. A sealing element associated with each reactor contacts a surface of a substrate disposed below the reactor, which defines isolated regions on the surface of the substrate. A dissolution rate monitor extends into each reactor to monitor a rate of real-time dissolution of one or more layers of each isolated region on the surface of the substrate when the dissolution rate monitor is disposed proximate to the surface of the substrate.

BRIEF DESCRIPTION OF THE DRAWINGS

The described embodiments and the advantages thereof may best be understood by reference to the following description taken in conjunction with the accompanying drawings. These drawings in no way limit any changes in form and detail that may be made to the described embodiments by one skilled in the art without departing from the spirit and scope of the described embodiments.

DETAILED DESCRIPTION

Semiconductor manufacturing may include a series of processing steps such as cleaning, surface preparation, deposition, patterning, etching, thermal annealing, and other related unit processing steps. The precise sequencing and integration of the unit processing steps enables the formation of functional devices meeting desired performance metrics such as efficiency, power production, and reliability.

As part of the discovery, optimization, and qualification of each unit process, it is desirable to be able to i) test different materials, ii) test different processing conditions within each unit process module, iii) test different sequencing and integration of processing modules within an integrated processing tool, iv) test different sequencing of processing tools in executing different process sequence integration flows, and combinations thereof in the manufacture of devices, such as integrated circuits. In particular, there is a need to be able to test i) more than one material, ii) more than one processing condition, iii) more than one sequence of processing conditions, iv) more than one process sequence integration flow, and combinations thereof, collectively known as "combinatorial process sequence integration," on a single monolithic substrate without the need of consuming the equivalent number of monolithic substrates per material(s), processing condition(s), sequence(s) of processing conditions, sequence(s) of processes, and combinations thereof. This can greatly improve both the speed and reduce the costs associated with the discovery, implementation, optimization, and qualification of material(s), process(es), and process integration sequence(s) required for manufacturing.

Systems and methods for High Productivity Combinatorial (HPC) processing are described in U.S. Pat. No. 7,544,574 filed on Feb. 10, 2006, U.S. Pat. No. 7,824,935 filed on Jul. 2, 2008, U.S. Pat. No. 7,871,928 filed on May 4, 2009, U.S. Pat. No. 7,902,063 filed on Feb. 10, 2006, and U.S. Pat. No. 7,947,531 filed on Aug. 28, 2009 which are all herein incorporated by reference. Systems and methods for HPC processing are further described in U.S. patent application Ser. No.

11/352,077 filed on Feb. 10, 2006, claiming priority from Oct. 15, 2005, U.S. patent application Ser. No. 11/419,174 filed on May 18, 2006, claiming priority from Oct. 15, 2005, U.S. patent application Ser. No. 11/674,132 filed on Feb. 12, 2007, claiming priority from Oct. 15, 2005, and U.S. patent application Ser. No. 11/674,137 filed on Feb. 12, 2007, claiming priority from Oct. 15, 2005 which are all herein incorporated by reference.

HPC processing techniques have been successfully adapted to wet chemical processing, such as etching and cleaning. HPC processing techniques have also been successfully adapted to deposition processes, such as physical vapor deposition (PVD), atomic layer deposition (ALD), and chemical vapor deposition (CVD).

Figure 1:
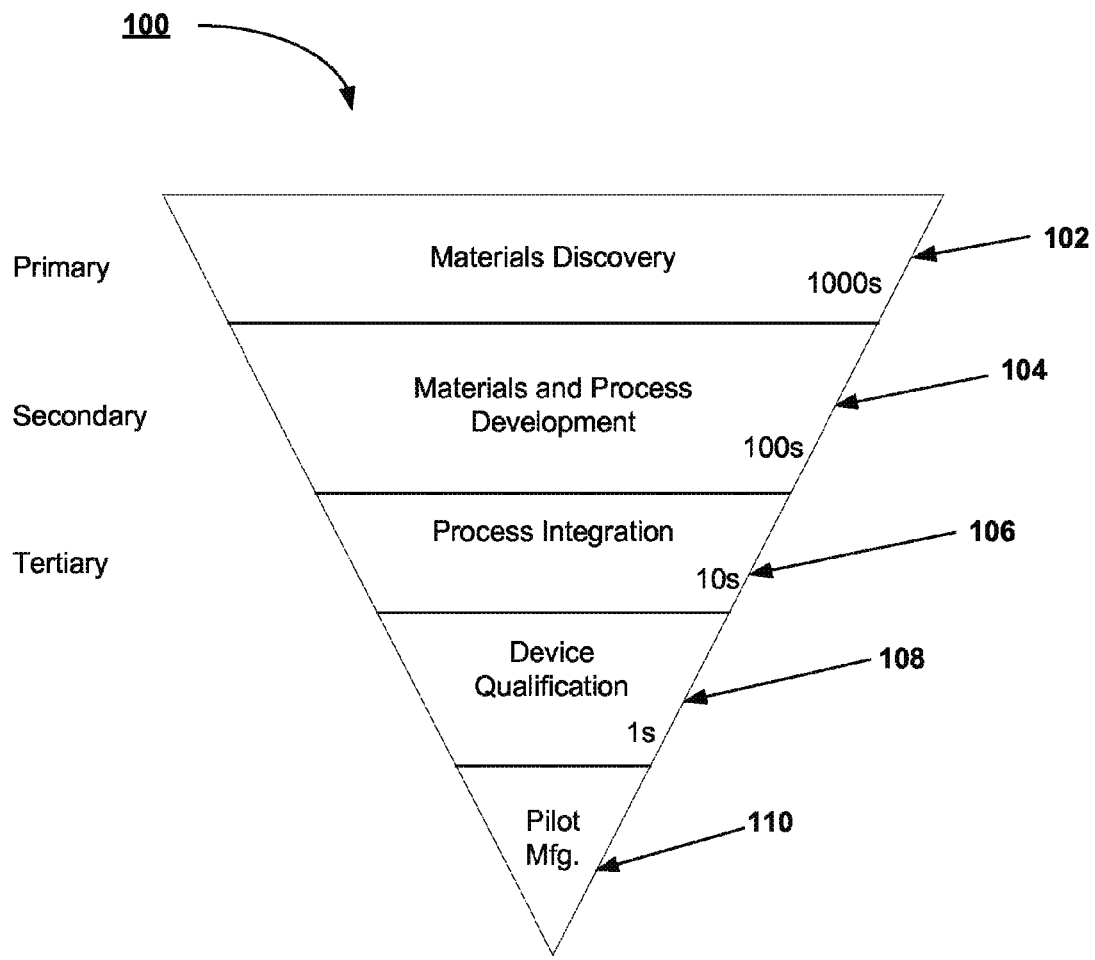
FIG. 1 is a schematic diagram, which illustrates an implementation of combinatorial processing and evaluation according to some embodiments.

FIG. 1 is a schematic diagram 100, which illustrates an implementation of combinatorial processing and evaluation using primary, secondary, and tertiary screening. The schematic diagram 100 illustrates the relative number of combinatorial processes that run with a group of substrates decreases as certain materials and/or processes are selected. Generally, combinatorial processing includes performing a large number of processes during a primary screen, selecting promising candidates from those processes, performing the selected processing during a secondary screen, selecting promising candidates from the secondary screen for a tertiary screen, and so on. In addition, feedback from later stages to earlier stages can be used to refine the success criteria and provide better screening results.

For example, thousands of materials are evaluated during a materials discovery stage 102. Materials discovery stage 102 is also known as a primary screening stage, performed using primary screening techniques. Primary screening techniques may include dividing substrates into coupons and depositing materials using varied processes. The materials are then evaluated and promising candidates are advanced to the secondary screen, such as a materials and process development stage 104. Evaluation of the materials is performed using metrology tools such as electronic testers and imaging tools, e.g. microscopes.

The materials and process development stage 104 may evaluate hundreds of materials (i.e., a magnitude smaller than the primary stage) and may focus on the processes used to deposit or develop those materials. Promising materials and processes are again selected and advanced to the tertiary screen, such as a process integration stage 106, where tens of materials and/or processes and combinations are evaluated. The tertiary screen or process integration stage 106 may focus on integrating the selected processes and materials with other processes and materials.

The most promising materials and processes from the tertiary screen are advanced to device qualification stage 108. In device qualification stage 108, the materials and processes selected are evaluated for high volume manufacturing, which normally is conducted on full substrates within production tools, but need not be conducted in such a manner. The results are evaluated to determine the efficacy of the selected materials and processes. If successful, the use of the screened materials and processes can proceed to pilot manufacturing stage 110.

The schematic diagram 100 is an example of various techniques that may be used to evaluate and select materials and processes for the development of new materials and processes. The descriptions of primary, secondary, etc. screening and the various stages, 102-110 are arbitrary and the stages may overlap, occur out of sequence, or be described and performed in many other ways.

The embodiments described herein enable the application of combinatorial techniques to process sequence integration in order to arrive at a globally optimal sequence of semiconductor manufacturing operations by considering interaction effects between the unit manufacturing operations, the process conditions used to effect such unit manufacturing operations, hardware details used during the processing, as well as materials characteristics of components utilized within the unit manufacturing operations. Rather than just considering a series of local optimums, i.e., where the best conditions and materials for each manufacturing unit operation is considered in isolation, the embodiments described herein consider interaction effects introduced due to the multitude of processing operations that are performed and the order in which such multitude of processing operations are performed when fabricating a device. A global optimum sequence order is therefore derived and as part of this derivation, the unit processes, unit process parameters, and materials used in the unit process operations of the optimum sequence order are also considered.

The embodiments described further analyze a portion or sub-set of the overall process sequence used to manufacture a semiconductor device. Once the subset of the process sequence is identified for analysis, combinatorial process sequence integration testing is performed to optimize the materials, unit processes, hardware details, and process sequence used to build that portion of the device or structure. During the processing of some embodiments described herein, structures are formed on the processed substrate, which are equivalent to the structures formed during actual production of the semiconductor device. For example, such structures may include, but would not be limited to, contact layers, buffer layers, absorber layers, or any other series of layers or unit processes that create an intermediate structure found on semiconductor devices. While the combinatorial processing varies certain materials, unit processes, hardware details, or process sequences, the composition or thickness of the layers or structures or the action of the unit process, such as cleaning, surface preparation, deposition, surface treatment, etc. is substantially uniform through each discrete region. Furthermore, while different materials or unit processes may be used for corresponding layers or steps in the formation of a structure in different regions of the substrate during the combinatorial processing, the application of each layer or use of a given unit process is substantially consistent or uniform throughout the different regions in which it is intentionally applied. Thus, the processing is uniform within a region (inter-region uniformity) and between regions (intra-region uniformity), as desired. It should be noted that the process can be varied between regions, for example, where a thickness of a layer is varied or a material may be varied between the regions, etc., as desired by the design of the experiment.

The result is a series of regions on the substrate that contain structures or unit process sequences that have been uniformly applied within that region and, as applicable, across different regions. This process uniformity allows comparison of the properties within and across the different regions such that the variations in test results are due to the varied parameter (e.g., materials, unit processes, unit process parameters, hardware details, or process sequences) and not the lack of process uniformity. In the embodiments described herein, the positions of the discrete regions on the substrate can be defined as needed, but are preferably systematized for ease of tooling and design of experimentation. In addition, the number, variants, and location of structures within each region are designed to enable valid statistical analysis of the test results within each region and across regions to be performed.

Figure 2:
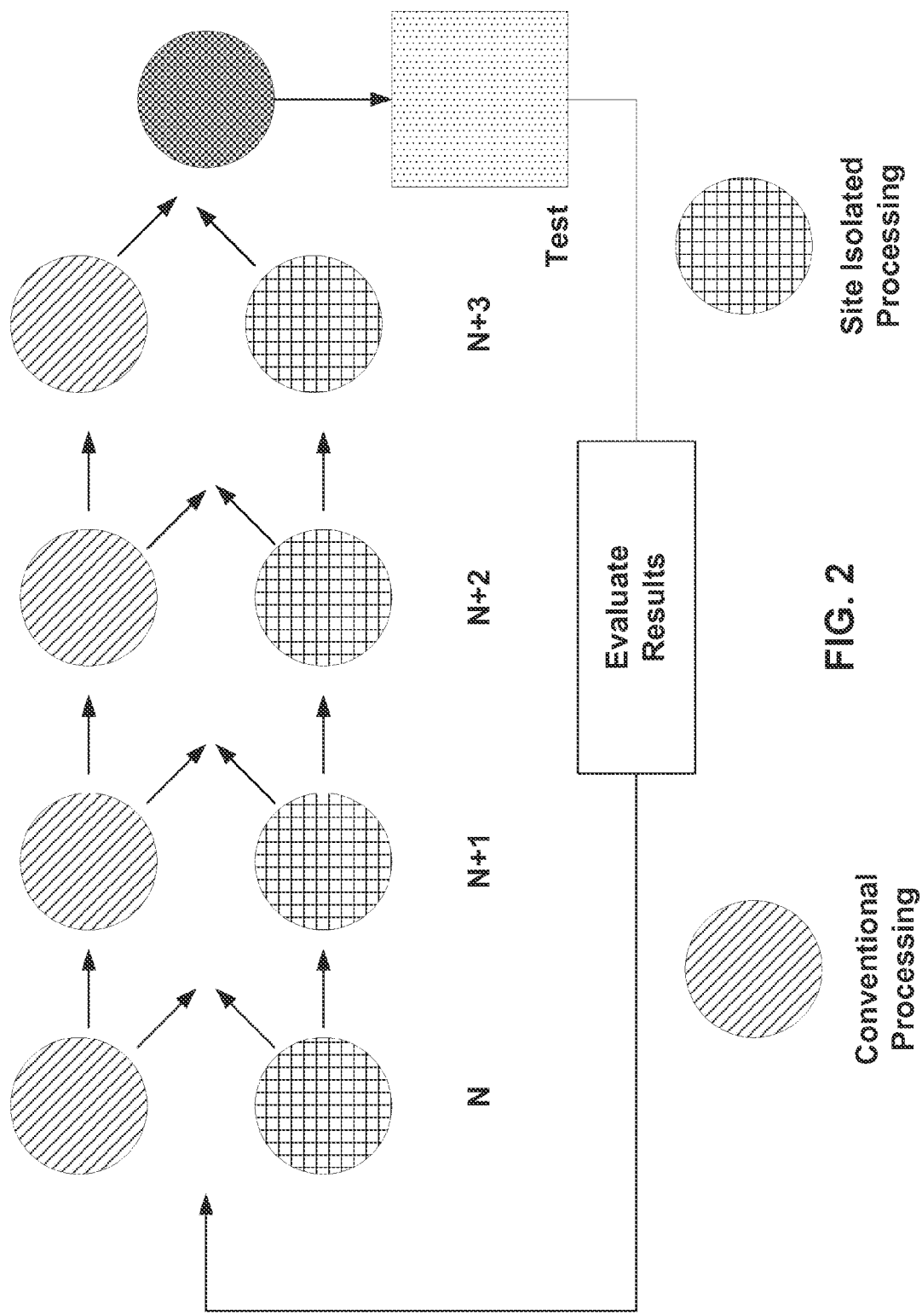
FIG. 2 is a schematic diagram illustrating a general methodology for combinatorial process sequence integration according to some embodiments.

FIG. 2 is a simplified schematic diagram illustrating a general methodology for combinatorial process sequence integration that includes site isolated processing and/or conventional processing in accordance with an embodiment of the invention. The substrate is initially processed using conventional process N. In an exemplary embodiment, the substrate is then processed using site isolated process N+1. During site isolated processing, an HPC module may be used, such as the HPC module described in U.S. patent application Ser. No. 11/352,077 filed on Feb. 10, 2006. The substrate can then be processed using site isolated process N+2, and thereafter processed using conventional process N+3. Testing is performed and the results are evaluated. The testing can include physical, chemical, acoustic, magnetic, electrical, optical, etc. tests. From this evaluation, a particular process from the various site isolated processes (e.g. from steps N+1 and N+2) may be selected and fixed, such that additional combinatorial process sequence integration may be performed using site isolated processing for either process N or N+3. For example, a next process sequence can include processing the substrate using site isolated process N, conventional processing for processes N+1, N+2, and N+3, with testing performed thereafter.

It should be appreciated that various other combinations of conventional and combinatorial processes can be included in the processing sequence with regard to FIG. 2. For instance, the combinatorial process sequence integration can be applied to any desired segments and/or portions of an overall process flow. Characterization, including physical, chemical, acoustic, magnetic, electrical, optical, etc. testing can be performed after each process operation and/or series of process operations within the process flow, as desired. The feedback provided by the testing is used to select certain materials, processes, process conditions, and process sequences and eliminate others. Furthermore, the above flows can be applied to entire monolithic substrates or portions of monolithic substrates, such as coupons.

Under combinatorial processing operations, the processing conditions at different regions can be controlled independently. Consequently, process material amounts, reactant species, processing temperatures, processing times, processing pressures, processing flow rates, processing powers, processing reagent compositions, the rates at which the reactions are quenched, deposition order of process materials, process sequence steps, hardware details, etc., can be varied from region to region on the substrate. Thus, for example, when exploring materials, a processing material delivered to a first and second region can be the same or different. If the processing material delivered to the first region is the same as the processing material delivered to the second region, this processing material can be offered to the first and second regions on the substrate at different concentrations. In addition, the material can be deposited under different processing parameters. Parameters which can be varied include, but are not limited to, process material amounts, reactant species, processing temperatures, processing times, processing pressures, processing flow rates, processing powers, processing reagent compositions, the rates at which the reactions are quenched, atmospheres in which the processes are conducted, an order in which materials are deposited, hardware details of the gas distribution assembly, etc. It should be appreciated that these process parameters are exemplary and are not meant to be an exhaustive list, as other process parameters used in semiconductor manufacturing may be varied.

As mentioned above, within a region, the process conditions are substantially uniform, in contrast to gradient processing techniques which rely on the inherent non-uniformity of the material deposition. That is, the embodiments described herein may locally perform the processing in a conventional manner, e.g., substantially consistent and substantially uniform, while globally over the substrate, the materials, processes, and process sequences may vary. Thus, the testing will find optimums without interference from process variation differences between processes that are meant to be the same. It should be appreciated that a region may be adjacent to another region in some embodiments or the regions may be isolated and therefore, non-overlapping. When the regions are adjacent, there may be a slight overlap wherein the materials or precise process interactions are not known; however, a portion of the regions, normally at least 50% or more of the area, is uniform and all testing occurs within that region. Further, the potential overlap is only allowed with material of processes that will not adversely affect the result of the tests. Both types of regions are referred to herein as regions or discrete regions.

The embodiments described below provide for a system that may be integrated into a combinatorial processing system, such as those available from the assignee, to determine real time dissolution and/or deposition rates without the need for running multiple time series experiments. In addition, the embodiments can capture useful information from the integrated dissolution rate monitor such as: induction layer thickness estimates with an initial dissolution rate, final dissolution rate, and average dissolution rates in order to provide information about the thin film dissolution at the surface, interfaces, and bulk.

Figure 3:
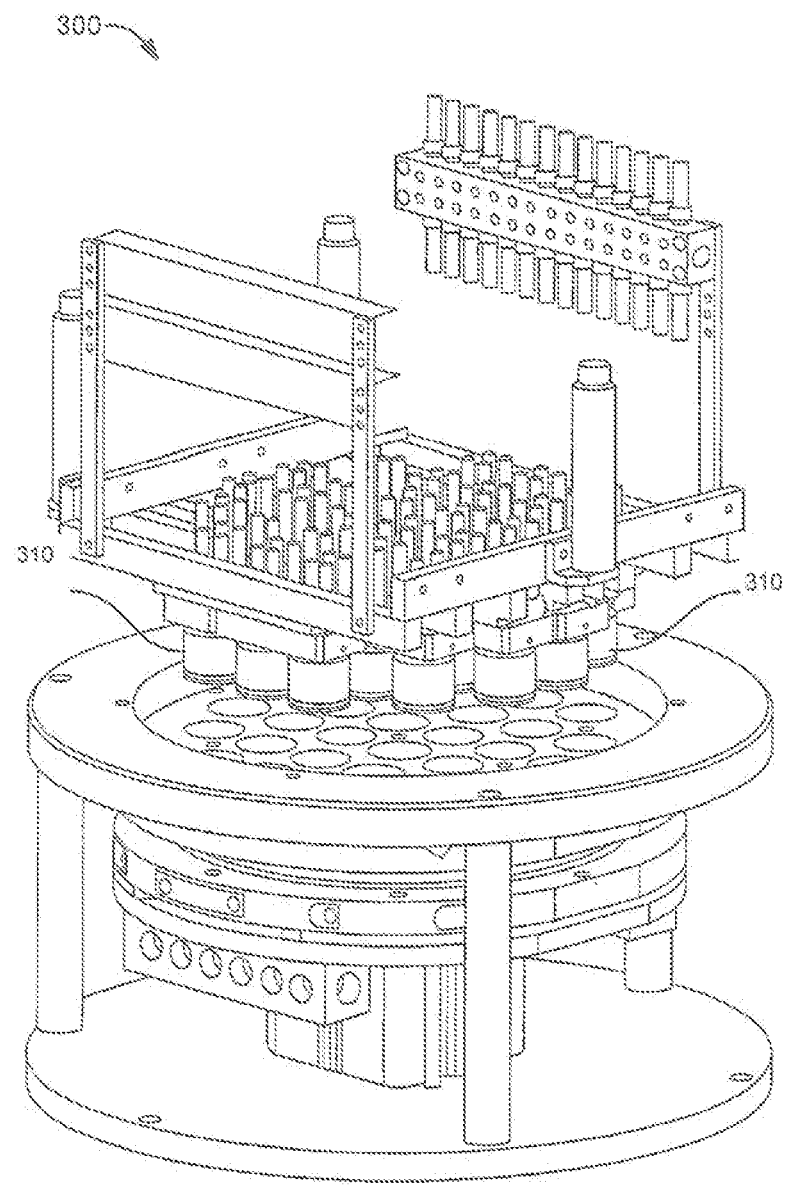
FIG. 3 is a schematic diagram of a combinatorial system according to some embodiments.

FIG. 3 is a schematic diagram of a combinatorial system 300, which may incorporate wet processing experiments or semiconductor manufacturing process sequences and unit operations in order to combinatorially evaluate various semiconductor manufacturing processes, such that an optimum process may be found in a minimum amount of time, in accordance with some embodiments of the invention. The combinatorial system 300 may also be referred to as a multiple channel site-isolated reactor system, and include the combinatorial systems owned by the assignee. Combinatorial system 300 includes a plurality of flow cells 310 which may be modular in design in order to efficiently evaluate a plurality of processes and utilize the same tool on various programs addressing customer specific problems. Such a system enables the use of customer specific wafers without requiring re-tooling. In some embodiments, twenty-eight flow cells are provided for twenty-eight discrete regions of a 12-inch wafer. It should be appreciated that this is not meant to be limiting, as any number of flow cells may be accommodated for any size wafer in a system. The number of flow cells 310 will depend upon various factors, including the size and shape of the substrate being evaluated, the size of the regions on the substrate, etc. A rail system enabling flow cells 310 to be tailored to any pitch (e.g., spacing) of regions is provided. A flexible reactor based system may be used, as well as a static manifold system. System 300 includes a plurality of connections (not shown for illustrative purposes) distributed to each of flow cells 310. The facilities connections remain intact, while the process module can be replaced with an alternative process module and mated with the facilities module through kinematic coupling in some embodiments.

The system 300 of FIG. 3 may be connected to various inputs that may be affixed to system 300 through racks or external to system 300. Example inputs include a dispense manifold to dispense any process fluids utilized in the system, a mix vessel for optionally mixing fluids prior to delivery to system 300, and any required power and gas inputs to operate the system. In addition, a waste collection mechanism may be in communication to receive process fluids evacuated from the reaction chambers or bypassed through flow cells 310.

In some embodiments, an endpoint detector is integrated into each flow cell 310 of the combinatorial system as illustrated in more detail below. In some embodiments, the endpoint detector is an etch rate monitor or a dissolution rate monitor. It should be appreciated that the endpoint detector may be operable to detect an end point of a deposition process where material is added to the surface of the substrate as well as an etch process that removes material from the surface of the substrate. System 300 of FIG. 3 is one illustrative embodiment of a system integrating the end point detector described herein and is not meant to be limiting as the embodiments may be integrated into any processing system.

Figure 4:
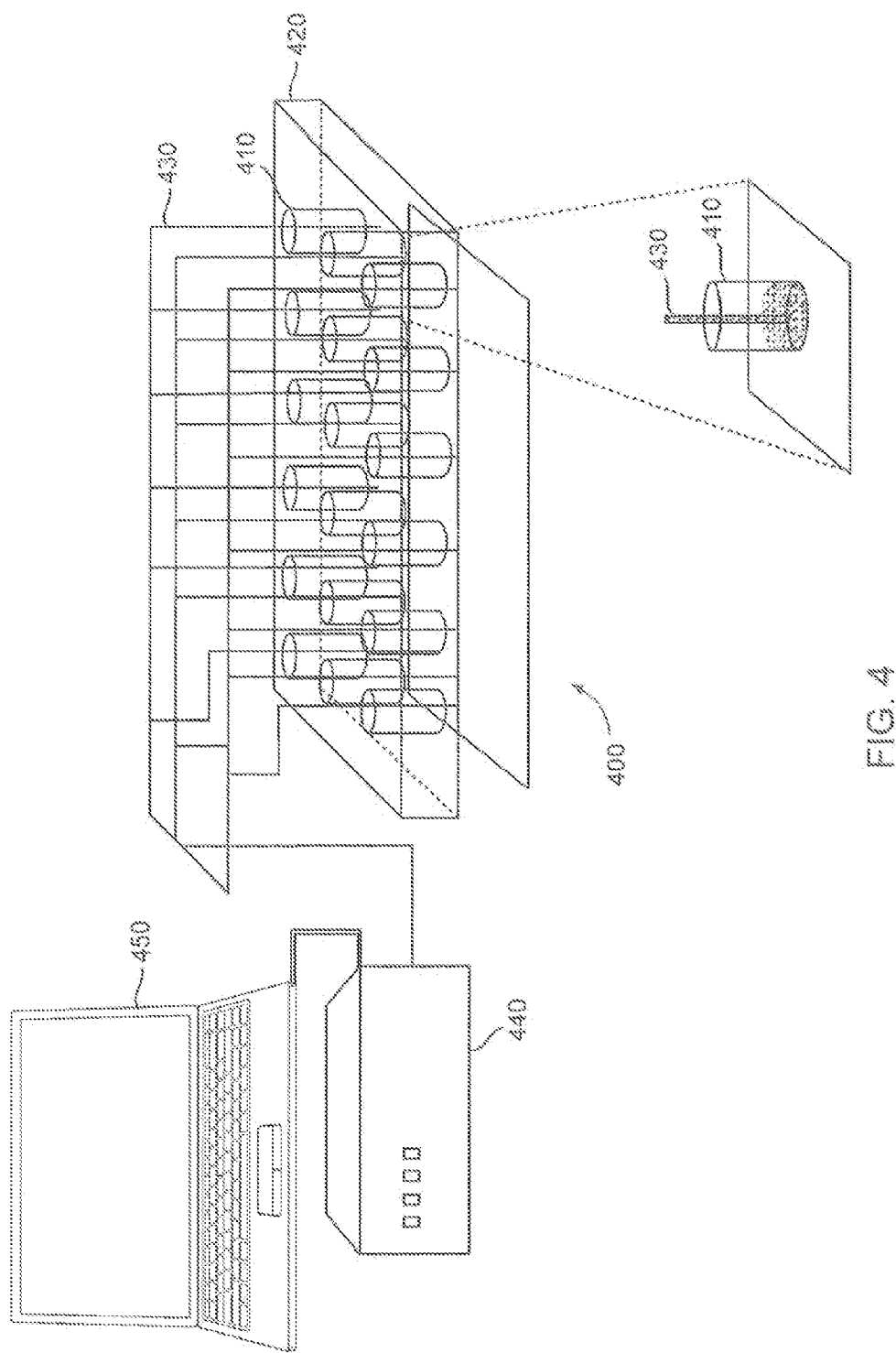
FIG. 4 is an illustration of a combinatorial system having an endpoint detector according to some embodiments.

FIG. 4 is an illustration of a combinatorial system 400 that contains eighteen independent processing cells 410, which may also be referred to as reactors. However, a combinatorial system containing other than eighteen independent processing cells is contemplated by some embodiments, such as a combinatorial system containing thirty-two independent processing cells. Each independent processing cell 410 processes a discrete and/or site isolated region of the substrate 420. Each independent processing cell 410 contains an endpoint detector 430. Real-time data is obtained using the endpoint detector 430, located in each processing cell 410 of the combinatorial system 400. The real-time data obtained by each endpoint detector 430 is recorded with a recording device in communication with a commercially available interferometer 440, in some embodiments. The combinatorial system 400 is controlled by a computing system 450. Processing cell 410 of combinatorial system 400 may include a stirrer, inlet ports, outlet ports, etc. as described below with reference to FIG. 5. It should be appreciated that the data captured from each end point detector may be stored in an informatics system or other suitable computing device for further processing.

Customized analysis on etch rate behavior during a single step reaction or multiple step reactions can be obtained with the combinatorial system 400. Since data is obtained in real time, it should be appreciated that there are no reaction times to be estimated for testing. In addition, allowing a reaction to proceed longer than desired is avoided due to the real time nature of the data gathering through the in-line dissolution rate monitor/end point detector. The combinatorial system 400 can be used to measure the homogeneity of an entire wafer or substrate for a single process or to apply independent processing to discrete regions of the wafer, both of which are measured and recorded in real time.

Figure 5:
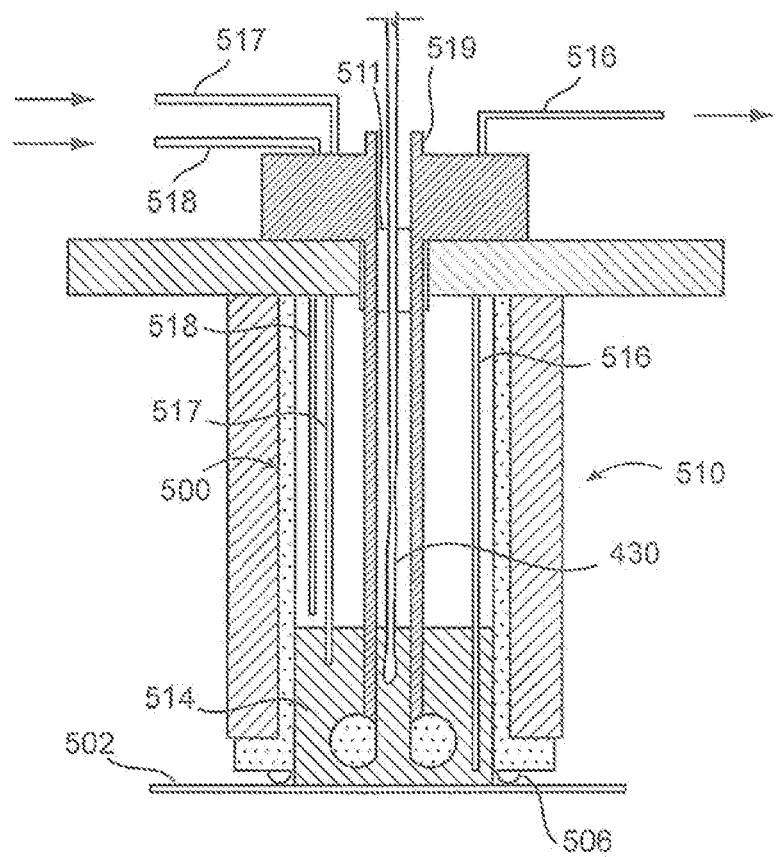
FIG. 5 is an illustration of a processing cell having an end point detector according to some embodiments.

FIG. 5 illustrates a processing cell of the combinatorial system in accordance with some embodiments. The processing cell 510 can have a cylindrical configuration having an inner diameter consummate with the size of the region or portion of the region of the substrate 502 that is to be isolated. The processing cell 510 can have a variety of other configurations, as FIG. 5 is just one example of a processing cell. For example, processing cell 510 may be configured as a flow cell with reference to FIG. 3 in some embodiments. The processing cell 510 contains a sealing element 506 at a bottom side of the processing cell 510, which forms a seal against the substrate 502 to contain processing fluids 514 used to process its associated discrete region of the substrate 502. In some embodiments, the sealing element is a removable sleeve, e.g., where the processing cell 510 is configured as a flow cell of the assignee.

When the processing cell 510 is in contact with the substrate 502, processing fluids 514 are delivered to an isolated region of the substrate 502 through a syringe of the delivery system of the combinatorial system in some embodiments. In some embodiments, the processing cell 510 is sealed on its upper surface, such as with a septum 511. When processing fluids 514 are delivered to the processing cell 510, a syringe may be provided to pierce the septum 511 to deliver the processing fluids in some embodiments. The processing cell 510 contains one or more fluid input lines connected to a top end of the cylindrical wall. The processing cell 510 optionally contains a vacuum line 516 for removing residual processing fluids and rinse solvents from the region of the substrate 502 subsequent to processing. A rinse line 518 is in fluid communication with a rinse solvent source for rinsing the processed region of the substrate 502, and a gas purge line 517 is in fluid communication with a purge gas source, such as argon or nitrogen for introducing a gas to the region of the substrate 502 before, during, and/or after processing. The gas purge line 517 can be designed to introduce gas into the processing cell 510 through the processing fluids 514 or to introduce the gas to the atmosphere of the processing cell 510. The vacuum line 516 and rinse line 518 are designed to remove and deliver fluids, respectively through the processing cell 510 to the isolated region of the substrate 502. It should be appreciated that the embodiment of FIG. 5 is one example and the process cell may have fluid delivered through dip tubes extending into the process cell or through an impeller shaft.

An agitation mechanism 519 is also shown in FIG. 5 to facilitate reactions. Some examples of the agitation mechanism 519 include, but are not limited to a physical stir rod, a magnetically-based agitator, a gas-based agitator, or a vibration-based agitator. A gear box is coupled to each agitation mechanism 519 to rotate the agitation mechanism disposed within the space formed by the process cell 510 in some embodiments. It should be appreciated that the speed of agitation can be varied, as well as the size and shape of the agitation mechanism 519. The agitation mechanism 519, also known as an impeller, stirs a fluid upon the substrate surface. The substrate 502 can also be globally agitated via a stage in a rotational, vibrational, or like fashion.

FIG. 5 also illustrates an endpoint detector 430. The endpoint detector 430 may be a dissolution rate monitor or an etch rate monitor in some embodiments. The endpoint detector 430 may be an optical fiber lead connected to a sensor and has a line of sight to the substrate surface. The endpoint detector 430 is coated with a chemical resistant film that does not attenuate laser wavelength or intensity in some embodiments. In some embodiments, the endpoint detector 430 is coated with a Polytetrafluoroethylene (PTFE) film. The endpoint detector 430 is placed within the processing fluids 514 proximate to or at a set distance above the surface of substrate 502, e.g., about seven millimeters from the substrate surface in some embodiments. However, the set distance can vary depending upon processing parameters and materials used.

The endpoint detector 430 can be a separate structure as illustrated in FIG. 5, or the endpoint detector can be integrated with the agitation mechanism 519 or some other structural feature of process cell 510 having a line of sight to the substrate surface being processed. In some embodiments, the endpoint detector 430 can be inserted through an interior vertical cavity of the agitation mechanism 519. The endpoint detector 430 monitors a rate of real-time dissolution of one or more layers of the surface of the substrate 502 when disposed near the surface of the substrate 502. In some embodiments end point detector detects interference when monochromatic light hits the sample surface, resulting in different optical path lengths due to film thickness and height variations in the film. The system calculates the etch rate and/or coating rate of the monitored region and detects the end-point from the prescribed film thickness and trench depth. A number of alternative configurations are available for providing endpoint detector 430 to the reaction area defined within the reactor or processing cell based on the structural features of the reactor, as long as the endpoint detector has a line of sight to the surface of the substrate being processed.

Embodiments provide an efficient determination for the start of the dissolution of a thin film and the completion of the dissolution of the thin film. An initial dissolution rate, a final dissolution rate, and an average dissolution rate can be obtained for a thin film from the system described herein. Subtle differences between an induction layer, a surface interlayer thin film, and the bulk substrate can be determined from differences in the dissolution rates, which are obtained and recorded by the combinatorial system in a data logger or other informatics system. The information obtained from the interferometer of the combinatorial system can be used to estimate an original thickness of the thin film layer, such as an induction layer thickness. It should be appreciated that an induction layer refers to a portion of a film that may have a different etch rate due to properties that are different than the bulk layer of the film in some embodiments. The embodiments can capture the different etch rates for these film portions in real time. In some embodiments an induction layer is formed in which an oxide or organic polymer has a slower dissolution rate than the bulk film layer. As an example, the dissolution rate for the first five Angstroms is different (faster or slower) than the bulk dissolution rate of the film. The real time data capture of the embodiments described herein, capture this data in an efficient manner. It should be further appreciated that while the embodiments refer to a dissolution rate monitor, this is not meant to be limiting as the end point detector may be utilized to detect the end point and deposition rate for a depositing material on the substrate surface.

Figure 6:
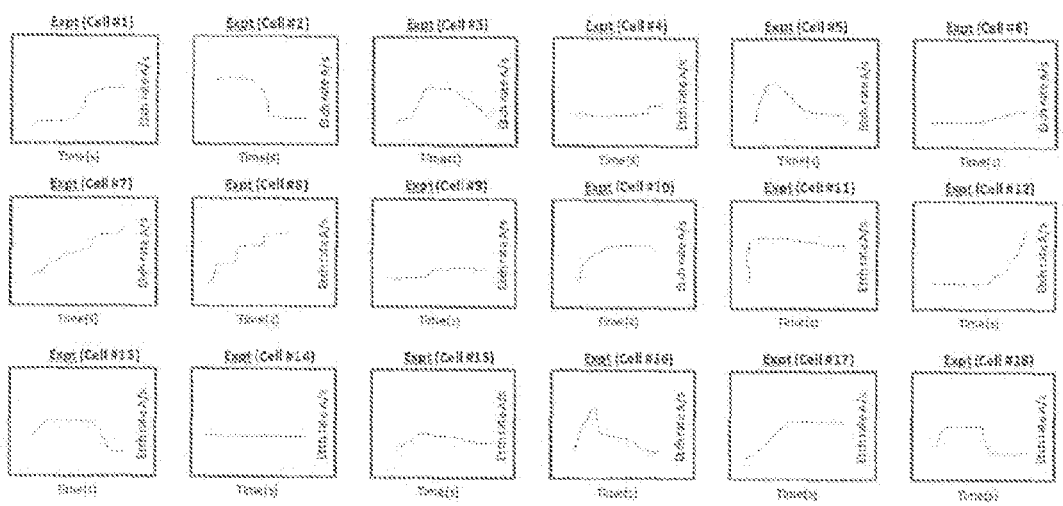
FIG. 6 is an illustration of sample output from the dissolution rate monitor for a combinatorial processing system according to some embodiments.

FIG. 6 is an illustration of experimental results obtained from the interferometer of the combinatorial system. FIG. 6 illustrates results from eighteen independent processing cells in which a copper thin film was etched. Each individual graph illustrates the etch rate in Angstroms per second for each respective independent processing cell. The real time data captured for the experiments within each process cell eliminates the need for multiple time series experiments to determine the etch rate. It should be appreciated that the real time data enables in situ measurements of the thickness of the layer during the reaction, thereby eliminating the need for taking the pre and post measurements of the thickness. Thus, rather than run a number of time series experiments to characterize the dissolution rate, all of the data can be captured in a single experiment with the real time dissolution rate monitoring system described herein. As noted above, differences in the film dissolution rate due to an induction layer are captured in real time through the in-situ dissolution rate monitor. Thus, the embodiments enable multiple experiments to be run on a substrate where different processing variables may be varied in order to determine an optimal combination in an efficient manner.

Figure 7:
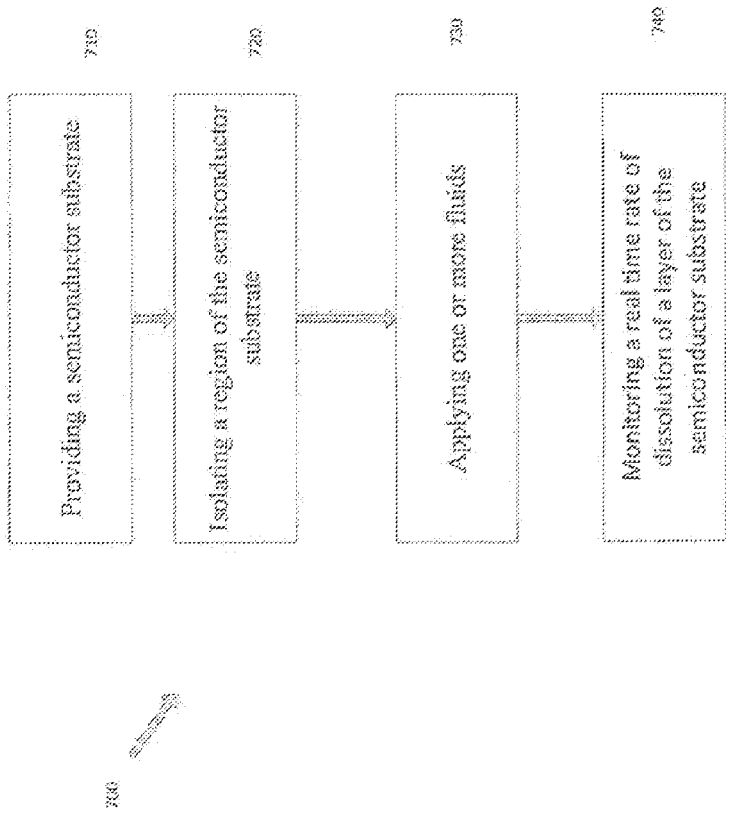
FIG. 7 is a flowchart of a method of monitoring a dissolution rate of a semiconductor substrate according to some embodiments.

FIG. 7 is a flowchart for a method 700 of monitoring a dissolution rate of a semiconductor substrate, according to embodiments of the invention. A semiconductor substrate comprising one or more layers is provided in step 710. The one or more layers may contain a conductive layer and/or a dielectric layer in some embodiments. The one or more layers may also include an induction layer. A region of the semiconductor substrate is isolated in step 720. A sealing element of a reactor may contact the surface of the semiconductor substrate, such as the sealing element illustrated in FIG. 5. In some embodiments, multiple regions of the surface of the semiconductor substrate are contemporaneously isolated through sealing elements of respective reactors. One or more fluids are applied to the isolated region of the surface of the substrate through the reactor or processing cell in step 730.

A real-time rate of dissolution of a layer of the semiconductor substrate is monitored via a dissolution rate monitor in step 740. Monitoring the real-time rate of dissolution can be implemented through a cavity of an impeller extending into a space defined by the reactor. The monitoring can occur contemporaneously with stirring the one or more fluids. In some embodiments, multiple regions of the surface of the semiconductor substrate can be contemporaneously monitored for a real-time rate of dissolution of the layer or layers of the semiconductor substrate. The dissolution rate of an induction layer disposed on the surface of the semiconductor substrate can also be monitored in some embodiments.

Although the foregoing embodiments of the invention have been described in some detail for purposes of clarity of understanding, it will be apparent that certain changes and modifications can be practiced within the scope of the appended claims. Accordingly, the present embodiments are to be considered as illustrative and not restrictive, and the embodiments are not to be limited to the details given herein, but may be modified within the scope and equivalents of the appended claims. In the claims, elements and/or steps do not imply any particular order of operation, unless explicitly stated in the claims.

What is claimed is:

1. A method of monitoring a dissolution rate of a semiconductor substrate, the method comprising:
providing a semiconductor substrate comprising one or more layers;
isolating a plurality of regions of a surface of the semiconductor substrate by contacting a sealing element of a reactor with the surface of the semiconductor substrate for each of the plurality of regions;
applying one or more fluids to each of the plurality of regions of the surface through the reactor; and
monitoring a real-time rate of dissolution of the semiconductor substrate via a dissolution rate monitor disposed within each of the plurality of regions.

2. The method of claim 1, further comprising:
recording the real-time rate of dissolution for each of the plurality of regions.

3. The method of claim 1, wherein the real-time rate of dissolution of each of the plurality regions is contemporaneously monitored.

4. The method of claim 1, wherein the monitoring comprises:
monitoring the real-time rate of dissolution through a cavity of an impeller extending into a space defined by the reactor.

5. The method of claim 1, wherein the monitoring occurs contemporaneously with stirring the one or more fluids.

6. The method of claim 1 wherein the monitoring comprises:
monitoring the dissolution rate of an induction layer disposed on the surface of the semiconductor substrate.

7. A multiple channel site-isolated reactor system, comprising:
a plurality of reactors;
one or more fluid input lines accessing a first end of each of the plurality of reactors;

a sealing element disposed at a second end of each of the plurality of reactors, wherein the sealing element is configured to form a sealing contact with a surface of a substrate; and a dissolution rate monitor extending into each of the plurality of reactors, wherein the dissolution rate monitor is operable to monitor a rate of real-time dissolution of one or more layers on the surface of the substrate when disposed near the surface of the substrate.

8. The system of claim 7, further comprising:
a gear box disposed over the first end of the cylindrical wall, the gearbox operable to rotate an impeller disposed within each of the plurality of reactors.

9. The system of claim 7, wherein the dissolution rate monitor comprises an optical fiber lead coupled to a sensor.

10. The system of claim 7, wherein the dissolution rate monitor is disposed within a cavity of an impeller configured to stir a fluid.

11. The system of claim 7, wherein the dissolution rate monitor is coupled to an interferometer that is configured to record the rate of real-time dissolution of the one or more layers.

12. The system of claim 7, wherein the dissolution rate monitor is coated with a chemically resistant film.

13. The system of claim 12, wherein the chemically resistant film is Polytetrafluoroethylene.

14. A multiple channel site-isolated reactor system, comprising:
a reactor block defining a plurality of reactors;
input lines accessing each reactor of the plurality of reactors, the input lines configured to provide a fluid to respective reactors;
a sealing element associated with each reactor of the plurality of reactors, the sealing element configured to contact a surface of a substrate disposed below the reactor block thereby defining isolated regions on the surface of the substrate; and
a dissolution rate monitor extending into each reactor of the plurality of reactors, wherein the dissolution rate monitor is operable to monitor a rate of real-time dissolution of one or more layers on the surface of the substrate when disposed proximate to the surface of the substrate.

15. The multiple channel site-isolated reactor system of claim 14, wherein the dissolution rate monitor is integrated within a cavity of an impeller of each reactor of the plurality of reactors.

16. The multiple channel site-isolated reactor system of claim 14, wherein each respective dissolution rate monitor independently monitors the rate of real-time dissolution for each respective isolated region on the surface of the substrate.

17. The multiple channel site-isolated reactor system of claim 14, wherein the dissolution rate monitor comprises an optical fiber lead coupled to a sensor.

18. The multiple channel site-isolated reactor system of claim 17, wherein the optical fiber lead is coated with Polytetrafluoroethylene.

19. The multiple channel site-isolated reactor system of claim 14, further comprising an interferometer coupled to a recording device.

20. The multiple channel site-isolated reactor system of claim 14, wherein the dissolution rate monitor is approximately 7 millimeters from the surface of the substrate.

* * * * *